US010511261B2

(12) United States Patent
Twieg et al.

(10) Patent No.: US 10,511,261 B2
(45) Date of Patent: Dec. 17, 2019

(54) SYSTEM AND METHOD FOR IMPROVED RF SYSTEM PERFORMANCE IN MRI SYSTEMS

(71) Applicant: Case Western Reserve University, Cleveland, OH (US)

(72) Inventors: Michael Twieg, Cleveland, OH (US); Mark A. Griswold, Shaker Heights, OH (US); Soumyajit Mandal, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 52 days.

(21) Appl. No.: 15/481,415

(22) Filed: Apr. 6, 2017

(65) Prior Publication Data

US 2017/0293003 A1 Oct. 12, 2017

Related U.S. Application Data

(60) Provisional application No. 62/320,263, filed on Apr. 8, 2016.

(51) Int. Cl.
*G01V 3/00* (2006.01)
*H03D 7/12* (2006.01)
(Continued)

(52) U.S. Cl.
CPC ......... *H03D 7/12* (2013.01); *G01R 33/3621* (2013.01); *H03D 7/165* (2013.01); *G01R 33/3415* (2013.01); *H03D 2200/0086* (2013.01)

(58) Field of Classification Search
CPC ...................................................... G01R 33/34
USPC ................................................ 324/322, 318
See application file for complete search history.

(56) References Cited

U.S. PATENT DOCUMENTS 5,166,620 A * 11/1992 Panosh ............. G01R 33/3607
324/307
7,403,011 B2 * 7/2008 Burdick, Jr. ..... G01R 33/34007
324/318

(Continued)

OTHER PUBLICATIONS

Andrews, C., et al., "A Passive Mixer-First Receiver With Digitally Controlled and Widely Tunable RF Interface," IEEE Journal of Solid-State Circuits, vol. 45, No. 12, pp. 2696-2708, Dec. 2010

(Continued)

*Primary Examiner* — Louis M Arana
(74) *Attorney, Agent, or Firm* — Quarles & Brady LLP; Jack M. Cook

(57) ABSTRACT

An apparatus, a system, and a chip are provided for improving RF system performance in MRI systems. The apparatus includes a radio-frequency (RF) coil array disposed at least partially in a coil housing, where the RF coil array may include at least one coil configured to receive magnetic resonance (MR) RF signals. The apparatus also includes a mixer disposed in the coil housing and electronically connected to the RF coil array, where the mixer converts MR RF signals from the RF coil array to intermediate-frequency (IF) signals. An electronic amplifier is disposed in the coil housing. The electronic amplifier is electronically connected to the mixer and is configured to amplify IF signals from the mixer to amplified IF signals.

26 Claims, 8 Drawing Sheets

(51) Int. Cl.
G01R 33/36 (2006.01)
H03D 7/16 (2006.01)
G01R 33/3415 (2006.01)

(56) References Cited

U.S. PATENT DOCUMENTS

| 7,449,886 | B2 | 11/2008 | Buchwald | |
|---|---|---|---|---|
| 8,049,505 | B2 | 11/2011 | Liere | |
| 8,487,622 | B2 * | 7/2013 | Biber | G01R 33/3692 |
| | | | | 324/318 |
| 8,866,482 | B2 * | 10/2014 | Bollenbeck | G01R 33/3621 |
| | | | | 324/318 |
| 8,988,076 | B2 * | 3/2015 | Mandal | G01R 33/3621 |
| | | | | 324/318 |

OTHER PUBLICATIONS

Andrews, C., et al., "Implications of Passive Mixer Transparency for Impedance Matching and Noise Figure in Passive Mixer-First Receivers," IEEE Transactions on Circuits and Systems I: Regular Papers, vol. 57, No. 12, pp. 3092-3103, Dec. 2010.

He, W. et al, "Four-channel magnetic resonance imaging receiver using frequency domain multiplexing," Review of Scientific Instruments, vol. 78, No, 1, p. 015102, 2007.

Maxim Integrated "Three Methods of Noise Figure Measurement," available at: maximintegrated.com/en/app-motes/ index.mvp/id/2875 Nov. 21, 2003, 7 pages.

Molnar, A., et al, "Impedance, filtering and noise in n-phase passive CMOS mixers," IEEE Custom Integrated Circuits Conference (CICC), 2012, pp. 1-8.

Reber, J., et al., "In-Bore Broadband Array Receivers with Optical Transmission," presented at the ISMRM, Milan, IT, 2014.

Riffe, M. J., et al., "Identification and mitigation of interference sources present in SSB-based wireless MRI receiver arrays: Interference Sources in SSB-Based MRI Receiver Arrays," Magnetic Resonance in Medicine, vol. 70, No. 6, pp. 1775-1786, Dec. 2013.

Sarpeshkar, et al., A Low-Power Wide-Linear-Range Transconductance Amplifier, C. Analog Integrated Circuits and Signal Processing (1997) 13: 123. https://doi.org/10.1023/A:1008292213687.

Wiggins, Graham C., et al. "96-Channel receive-only head coil for 3 Tesla: design optimization and evaluation." Magnetic Resonance in Medicine: An Official Journal of the International Society for Magnetic Resonance in Medicine 62.3 (2009): 754-762.

* cited by examiner

SYSTEM AND METHOD FOR IMPROVED RF SYSTEM PERFORMANCE IN MRI SYSTEMS

CROSS-REFERENCE TO RELATED APPLICATION

This application is based on, claims the benefit of, and incorporates herein by reference in its entirety, U.S. Provisional Application Ser. No. 62/320,263, filed Apr. 8, 2016, and entitled, "System and Method for Improved RF System Performance in MRI Systems."

STATEMENT REGARDING FEDERALLY SPONSORED RESEARCH

This invention was made with government support under NIH-1R01NS083654 awarded by National Institutes of Health. The government has certain rights in the invention.

BACKGROUND

The disclosure relates to systems and methods for magnetic resonance imaging ("MRI") and, more particularly, to systems and methods for improving the performance of RF system in an MRI system.

When a substance such as human tissue is subjected to a uniform magnetic field (polarizing field $B_0$), the individual magnetic moments of the nuclear spins in the tissue attempt to align with this polarizing field, but precess about it in random order at their characteristic Larmor frequency. Usually the nuclear spins are comprised of hydrogen atoms, but other NMR active nuclei are occasionally used. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$; also referred to as the radiofrequency (RF) field) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation field $B_1$ is terminated. There are a wide variety of measurement sequences in which this nuclear magnetic resonance ("NMR") phenomenon is exploited.

When utilizing these signals to produce images, magnetic field gradients ($G_x$, $G_y$, and $G_z$) are employed. Typically, the region to be imaged experiences a sequence of measurement cycles in which these gradients vary according to the particular localization method being used. The emitted MR signals are detected using a receiver coil. The MRI signals are then digitized and processed to reconstruct the image using one of many well-known reconstruction techniques.

To excite and acquire these MRI signals, RF systems are included as key components of any MRI system. Dense MRI receiver arrays face challenges associated with RF cabling, power consumption, and space required by on-coil RF LNAs (low-noise amplifiers).

As such, there continues to be a need for improved RF systems for MRI.

SUMMARY

The present disclosure provides systems and method that overcomes the aforementioned drawbacks. In a first aspect, an apparatus includes a radio-frequency (RF) coil array disposed at least partially in a coil housing, where the RF coil array may include at least one coil configured to receive magnetic resonance (MR) RF signals. The apparatus also includes a mixer disposed in the coil housing and electronically connected to the RF coil array, where the mixer converts the MR RF signal from the RF coil array to an intermediate-frequency (IF) signal. An electronic amplifier is disposed in the coil housing. The electronic amplifier is electronically connected to the mixer and is configured to amplify the IF signal from the mixer to an amplified IF signal.

In another aspect, an MRI system is provided. The MRI system includes a magnet system configured to generate a static magnetic field about at least a region of interest (ROI) of a subject arranged in the MRI system and at least one gradient coil configured to establish at least one magnetic gradient field with respect to the static magnetic field. The MRI system also includes a radio frequency (RF) system configured to deliver at least one excitation pulse to the subject and at least one computer system configured to reconstruct images of the subject from image data acquired by the MRI system. The magnet system, gradient coil, and RF system are arranged in a first location defining a magnet room and the at least one computer system is located in a second location that is magnetically distinct from the magnet room. The MRI system further includes a receiver including an RF coil array comprising at least one coil configured to receive magnetic resonance (MR) RF signals excited by the at least one excitation pulse in the ROI and a mixer electrically coupled to the RF coil array and arranged in the magnet room, wherein the mixer converts the MR RF signal from the RF coil array to an intermediate-frequency (IF) signal. The receiver also includes an electronic amplifier electrically connected to the mixer to amplify the IF signal from the mixer to an amplified IF signal and arranged in the magnet room.

In yet another aspect, an integrated circuit (chip) is provided. The chip includes a semiconductor layer, a mixer disposed in the semiconductor layer, and an electronic amplifier disposed in the semiconductor layer. The mixer is configured to receive magnetic resonance (MR) RF signals from a coil array and convert the MR RF signal to an intermediate-frequency (IF) signal. The electronic amplifier is electronically connected to the mixer and is configured to amplify the IF signal from the mixer to an amplified IF signal.

The foregoing and other aspects and advantages of the disclosure will appear from the following description. In the description, reference is made to the accompanying drawings which form a part hereof, and in which there is shown by way of illustration a preferred embodiment of the disclosure. Such embodiment does not necessarily represent the full scope of the disclosure, however, and reference is made therefore to the claims and herein for interpreting the scope of the disclosure.

While the above-identified figures set forth one or more embodiments of the apparatus or systems, other embodiments are also contemplated, as noted in the disclosure. In all cases, this disclosure presents the different embodiments by way of representation and not limitation. It should be understood that numerous other modifications and embodiments can be devised by those skilled in the art which fall within the scope and spirit of the principles of this disclosure.

DETAILED DESCRIPTION

Figure 1:
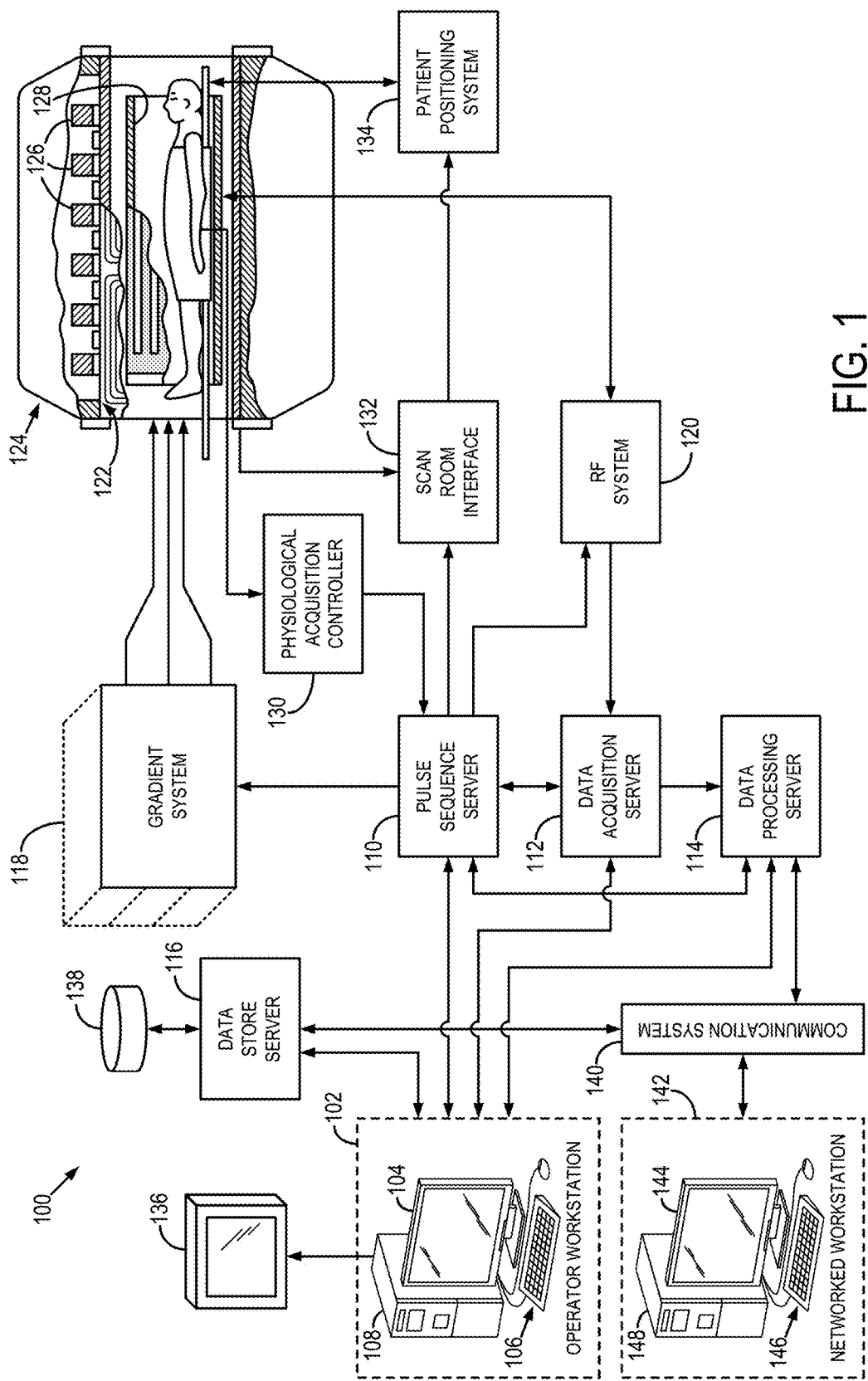
FIG. 1 is a block diagram illustrating an example of a magnetic resonance imaging system for use in accordance with the present disclosure.

Referring to FIG. 1, an example of a magnetic resonance imaging (MRI) system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 328 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the in-phase (I) and quadrature (Q) components of the received magnetic resonance signal. The magnitude of the received magnetic resonance signal may, therefore, be determined at any sampled point by the square root of the sum of the squares of the I and Q components:

$$M=\sqrt{I^2+Q^2} \tag{1}$$

and the phase of the received magnetic resonance signal may also be determined according to the following relationship:

$$\varphi = \tan^{-1}\left(\frac{Q}{I}\right). \tag{2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 316 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 340. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2A:
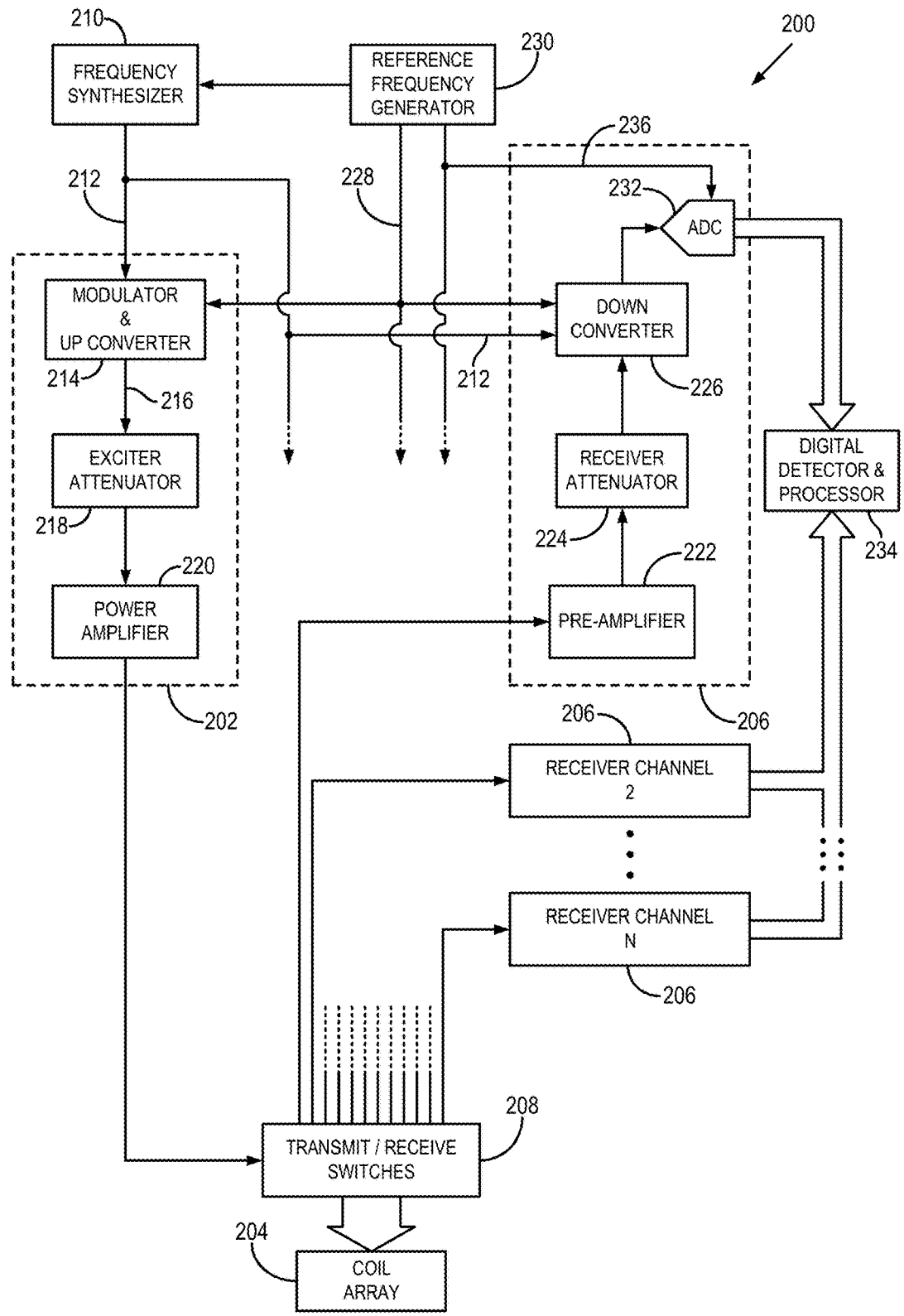
FIG. 2A is a block diagram illustrating an RF system of the MRI system of FIG. 1.

As shown in FIG. 1, the RF system 120 may be connected to the whole body RF coil 128. Often, the transmitter section is connected to the whole body RF coil 128 or a local transmit coil (not shown). Alternatively, as shown in FIG. 2A, a transmitter section of the RF system 200 may connect to at least one transmit channel 202 of a coil array 204 via transmit/receiver switches 208. A receiver section of the RF system 200 may connect to at least one receiver channel 206 of the coil array 204. In some receive coil arrays, each receiver section may be connected to a separate receiver channel 206. In either case, as will be described below, traditional systems have placed a pre-amplifier 222 and receiver attenuator 224 proximate to the bore through the magnet assembly 124 or, more accurately, in the "magnet room" with the magnet assembly 124. This is done because the pre-amplifier 222 is specially designed to tolerate the noise present in the signals, but necessitates the use of very-expensive high-frequency cables to connect the pre-amplifier 222 and receiver attenuator 224 to a frequency down converter 226 and analog-to-digital converter (ADC) 232. As such, some have attempted to move the down converter 226 and ADC 232 into the magnet room with the magnet assembly 124. However, this further complicates the design by subjecting even further electronics to the operating environment of the magnet assembly 124 and pushing more and fairly large electronics into the magnet room with the magnet assembly 124.

Continuing with respect to FIGS. 1 and 2A, the RF system 120 includes a transmitter that produces a prescribed RF excitation field. The base, or carrier, frequency of this RF excitation field is produced under control of a frequency synthesizer 210 that receives a set of digital signals from the pulse sequence server 110. These digital signals indicate the frequency and phase of the RF carrier signal produced at an output 212. The RF carrier is applied to a modulator and up converter 214 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 216 is attenuated by an exciter attenuator circuit 218 that receives a digital command from the pulse sequence server 110. The attenuated RF excitation pulses are applied to a power amplifier 220, which drives the RF coil array 204 through transmit/receive ("T/R") switches 208.

Referring still to FIG. 2A, the signal produced by the subject is picked up by the coil array 204 and applied to the inputs of a set of receiver channels 206. The pre-amplifier 222 in each receiver channel 206 amplifies the signal by an amount determined by a digital attenuation signal received from the pulse sequence server 110. The receiver channel 206 may include the receiver attenuator 224 connected between the pre-amplifier 222 and the down convertor 226. Again, traditional systems have placed a pre-amplifier 222 and receiver attenuator 224 proximate to the bore through the magnet assembly 124 or, more accurately, in the "magnet room" with the magnet assembly 124. This is done because the pre-amplifier 222 is specially designed to tolerate the noise present in the signals, but necessitates the use of very-expensive, high-frequency cables to connect the pre-amplifier 222 and receiver attenuator 224 to a down converter 226 and analog-to-digital converter (ADC) 232.

The received signal is at or around the Larmor frequency, and this high frequency signal is down-converted in a two-step process by a down converter 226, which first mixes the detected signal with the carrier signal on line 212 and then mixes the resulting difference signal with a reference signal on line 228. The down converted MR signal is applied to the input of the ADC 232 that samples and digitizes the analog signal and applies it to a digital detector and signal processor 234 that produces 16-bit in-phase values and 16-bit quadrature values corresponding to the received signal. The resulting stream of digitized I and Q values of the received signal are output to the data acquisition server 112. The reference signal on line 228, as well as the sampling signal on line 236 applied to the ND converter 232, are produced by a reference frequency generator 230.

Figure 2B:
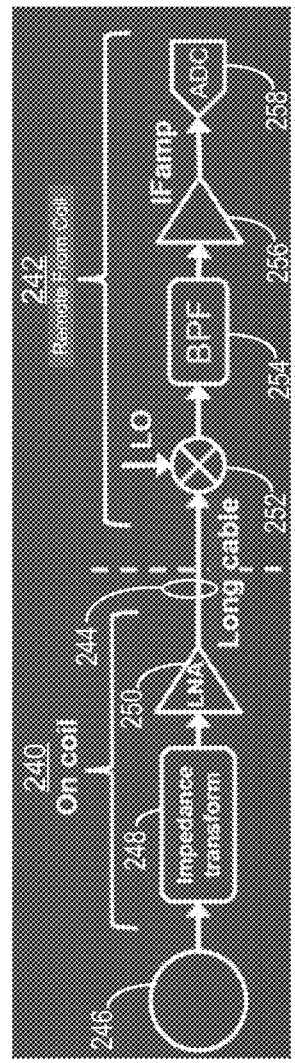
FIG. 2B is a block diagram illustrating a traditional RF system of an MRI system.

Referring to FIG. 2B, as referenced above, RF signal processing for MR is typically divided between components/hardware that is located proximate to the RF coil 240 and components/hardware or software that is located remotely from the coil 242, such as outside the magnet room or "in the scanner" or "workstation." That is, the location remote from the coil 242 is magnetically distinct from the magnet room that houses the magnet and coil 242, meaning that the location remote from the coil 242 can safely include ferromagnetic materials without interference from the magnet of the MRI system. In these traditional configurations, the components/hardware that are located proximate to the RF coil 240 and components/hardware or software that is in the scanner 242 are coupled by a long cable 244, which is often several meters long. In particular, a coil or coil element 246 positioned on a patient has an impedance transformer 248 and low-noise amplifier 250 that are coupled to or integrated with the hardware of the coil 240. These on-coil components 240 receive the MR RF signal and prepare it for amplified transmission along the long cable 244 to the components and processing that is remote from the coil. Once the signal is remote from the coil 242, it is processed by hardware and software that is typically designed to reside outside the magnet room of the MRI system. For example, such hardware and software may include a mixer 252 that receives a reference LO signal, passes the processed signal to a band pass filter 254, whereby it is amplified by an amplifier 256 and then digitized by an ADC 258.

By arranging the majority of the hardware and processing remote from the coil 242, these components can be designed to operate outside the challenging environment of the magnet room. Thus, the design constraints for the components that are remote from the coil 242 are relaxed, compared to components that would be capable of operating within the magnet room or proximate to the magnet. However, to transmit this high-frequency, MR RF signal over the long cable 244, the long cable 244 must be well shielded and of high fidelity. Thus, the long cable 244 presents a substantial expense. Furthermore, using a LNA suitable for MR RF signals requires the use of a large, high Q inductor and necessitates one cable per channel. Thus, this traditional design presents substantial inherent costs and limitations.

Receive arrays for MRI system are trending towards higher channel counts in order to increase coverage, while maintaining good SNR and enabling acceleration with parallel imaging. However, increased density poses engineering challenges, including the physical size of on-coil LNAs and the routing of RF cables for each channel. Prior work has explored frequency mixing on-coil for frequency domain multiplexing, such as described in W. He, X. Qin, R. Jiejing, and L. Gengying, "Four-channel magnetic resonance imaging receiver using frequency domain multiplexing," *Review of Scientific Instruments*, vol. 78, no. 1, p. 015102, 2007; M. J. Riffe, M. D. Twieg, N. Gudino, C. J. Blumenthal, J. A. Heilman, and M. A. Griswold, "Identification and mitigation of interference sources present in SSB-based wireless MRI receiver arrays: Interference Sources in SSB-Based MRI Receiver Arrays," *Magnetic Resonance in Medicine*, vol. 70, no. 6, pp. 1775-1786, December 2013; and R. H. Buchwald, "MR receiver assembly having readout cables capable of multiple channel transmissions," U.S. Pat. No. 7,449,886 B2, 11 Nov. 2008. However, the use of discrete frequency mixers is problematic due to their poor gain and noise figure by, for example, F. V. Liere, "MRI system with direct digital receiver using resampling," U.S. Pat. No. 8,049,505 B2, 1 Nov. 2011 and J. Reber, D. O. Brunner, T. Schmid, U. Moser, B. E. Dietrich, C. Barmet, and K. P. Pruessmann, "In-Bore Broadband Array Receivers with Optical Transmission," presented at the ISMRM, Milan, IT, 2014. However, the lack of frequency translation requires high sampling rates and power dissipation. The present disclosure provides systems and methods that can use passive N-path mixers implemented in, for example, complementary metal-oxide-semiconductors (CMOS) technology, to provide on-coil frequency conversion and overcome many of the challenges of traditional systems.

Some, such as, C. Andrews and A. C. Molnar, "A Passive Mixer-First Receiver With Digitally Controlled and Widely Tunable RF Interface," *IEEE Journal of Solid-State Circuits*, vol. 45, no. 12, pp. 2696-2708, Dec. 2010; C. Andrews and A. C. Molnar, "Implications of Passive Mixer Transparency for Impedance Matching and Noise Figure in Passive Mixer-First Receivers," *IEEE Transactions on Circuits and Systems I: Regular Papers*, vol. 57, no. 12, pp. 3092-3103, Dec. 2010; and A. Molnar and C. Andrews, "Impedance, filtering and noise in n-phase passive CMOS mixers," *IEEE Custom Integrated Circuits Conference (CICC)*, 2012, pp. 1-8 have demonstrated a mixer-first tunable receiver core based on N-path mixers and baseband low noise amplifiers integrated on a single CMOS die (TSMC 65 nm process). However, as will be described herein, the present disclosure applies these principles to MRI; specifically, to provide systems and methods to provide frequency conversion in the magnet room, such as on or proximate to the coil. Furthermore, digitization can be provided in the magnet room, such as on or proximate to the coil. In this case, the ADC may be used to digitize and mix signals. In this system, the MR RF signal is transformed to an intermediate frequency (IF) signal, which negates the need for the high Q inductor for RF low noise amplification.

Figure 3:
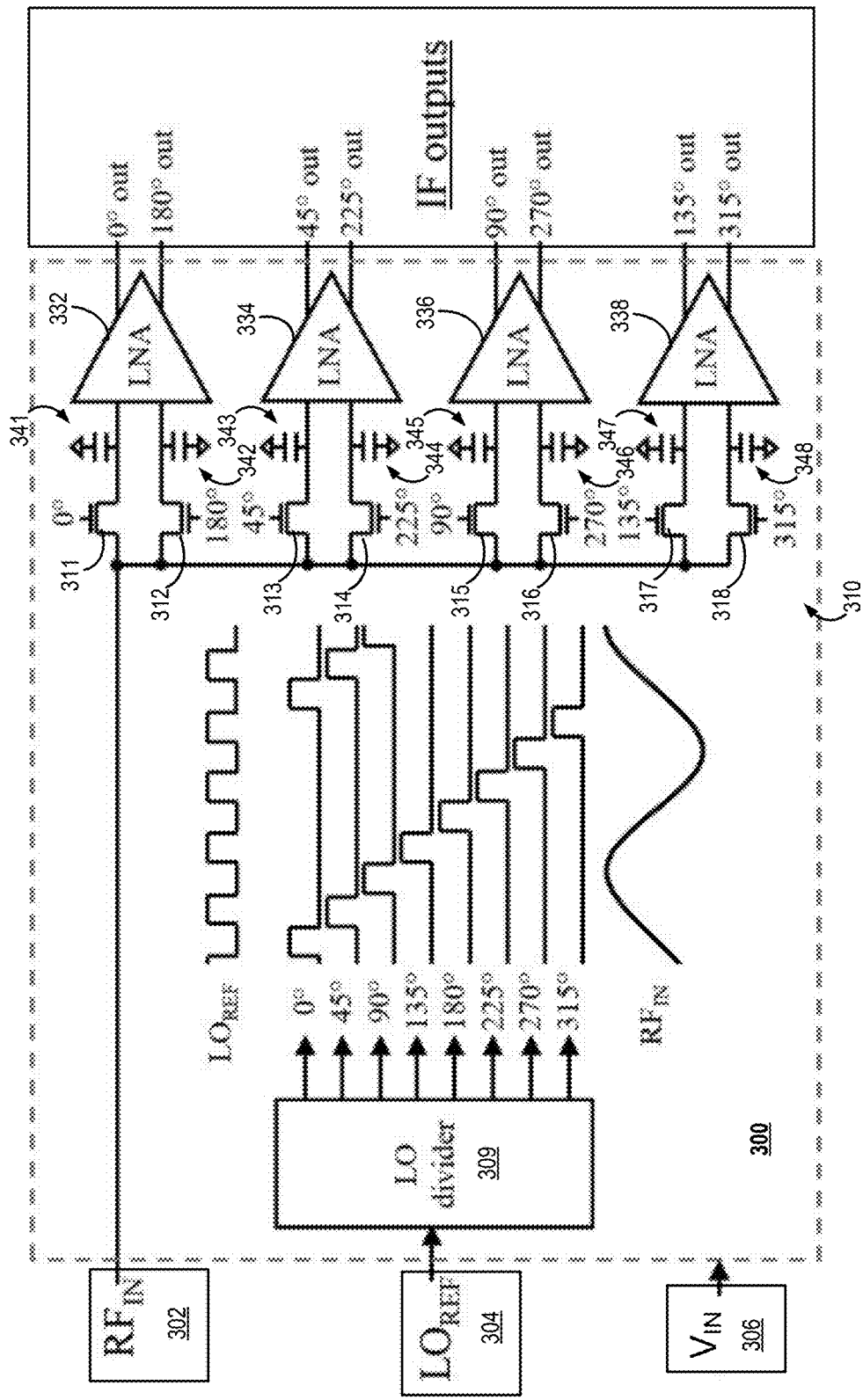
FIG. 3 is a block diagram of a receiver core in accordance with the present disclosure, as well as the interleaved LO divider.

As illustrated in FIG. 3, a receiver core 300 is provided that is designed for operation at MR RF frequencies, such as $f_{RF}$=64 MHz, as a non-limiting example. The receiver core 300 can include an interleaved LO divider 309. As illustrated, the receiver core 300 includes a mixer 310 formed of N individual mixers 311-318 . . . that receive a reference signal from $RF_{IN}$ 302. The receiver core 300 also receives voltage input from $V_{IN}$ 306. The LO divider 309 takes a reference LO (with frequency $(f_{LO} \cdot N)/2$) 304 and divides it into N non-overlapping pulses with interleaved phase, each of which feeds a path to the mixers 311-318. As a non-limiting example, the RF source impedance may be 50Ω.

The mixers 311-318 may present N paths implemented with N switches/sampling capacitors. The mixers 311-318 may receive N interleaved, non-overlapping drive signals at a local oscillator frequency $f_{LO}$. The output of the mixers 311-318 may include N polyphase outputs at $f_{IF}$. The noise figure of the mixers 311-318 may decrease when N increases. For example, when N=4, the noise figure is 0.912 db, when N=8, the noise figure is 0.224 db, and when N=16, the noise figure is 0.056 dB.

In most configurations, N may be a number that equals to the number of coils in a connected coil array. For instance, when the coil array includes 64 coils, the receiver core may also include 64 mixers. The LO divider 309 outputs N non-overlapping pulses with a phase difference of 360/N degrees between two adjacent outputs. When N is 8, as in the illustrated, non-limiting example, the phase difference is 45 degrees between two adjacent outputs. The eight outputs may be divided into four pairs, where each pair includes two outputs with a phase difference of 180 degrees. The first output with 0° phase delay is input to a mixer 311 and the fifth output with 180° phase delay is input to a subsequent mixer 312. The second output with 45° phase delay is input to another mixer 313 and the sixth output with 225° phase delay is input to a corresponding mixer 314. The third output with 90° phase delay is input to a mixer 315 and the fifth output with 270° phase delay is input to another mixer 316.

The first output with 135° phase delay is input to a mixer 317 and the fifth output with 315° phase delay is input to a mixer 318. The mixers 311 and 312 are electronically connected to an amplifier 332. The mixers 313 and 314 and electronically connected to a respective amplifier 334. The mixers 315 and 316 and electronically connected to an amplifier 336. The mixers 317 and 318 and electronically connected to an amplifier 338.

In one non-limiting example, the receiver may receive a 252 MHz reference LO, which is split into eight non-overlapping pulses at 63 MHz that drive the switches of an eight-path passive mixer 310, such as described above with respect to FIG. 3 and formed by mixers 311-318. In this non-limiting example, eight intermediate frequency signals are at $f_{IF}$=1 MHz with interleaved phase, which are then communicated to four differential IF LNAs, such as described above with respect to LNAs 332-338. The gain of the LNAs and the dead time of the LO pulses may be digitally adjustable, such as with a serial peripheral interface (SPI). As also illustrated in FIG. 3, sampling capacitors 341-348 are provided with the mixers 311-318 and may also be implemented on-chip.

Figure 4:
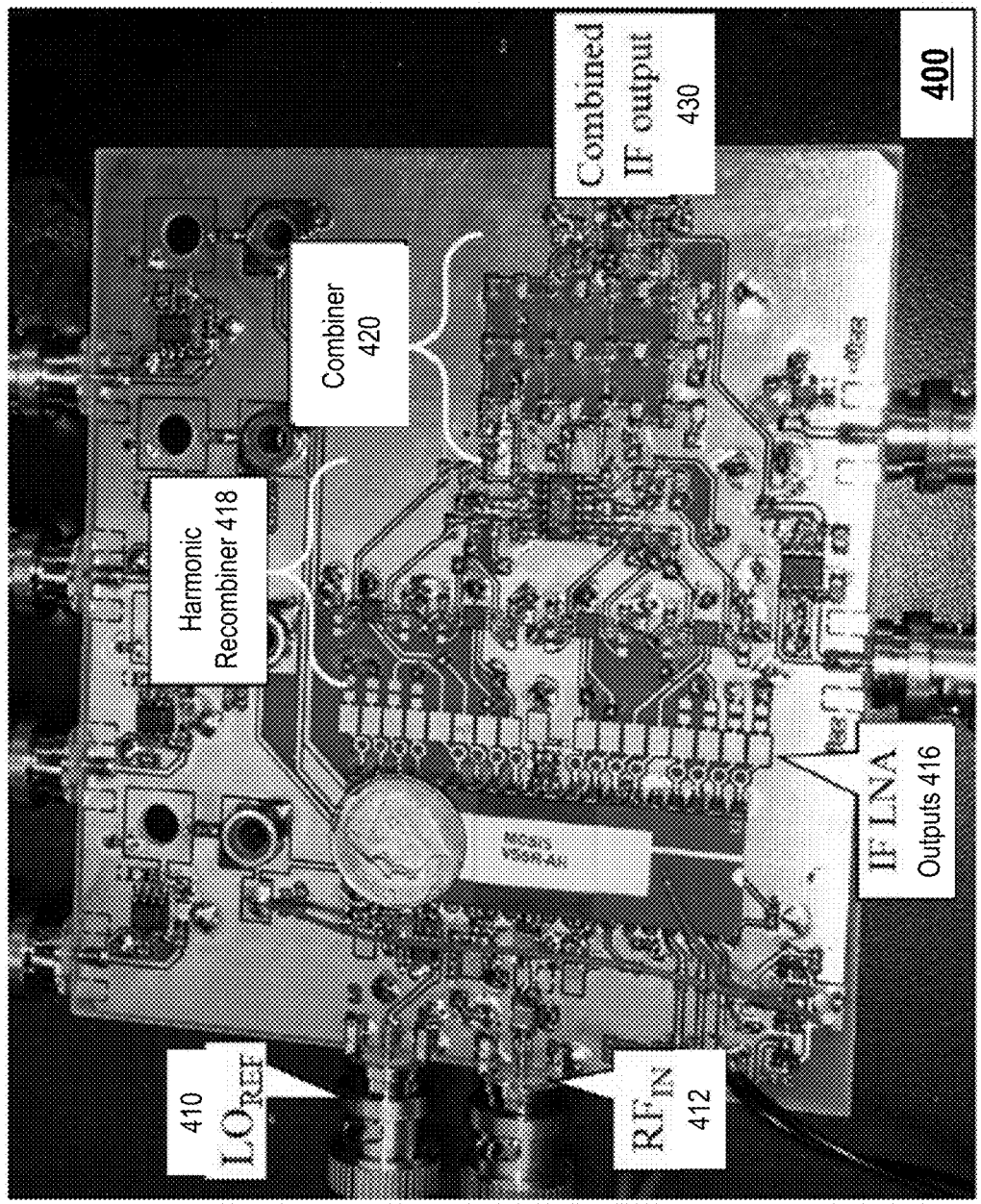
FIG. 4 is a picture of a Test PCB with optional IF combination circuitry in accordance with the present disclosure.

Referring to FIG. 4, the gain, single sideband noise figure, IP1 dB, and power consumption of the mixer were measured experimentally. Dynamic range (DR) was calculated assuming a non-limiting channel bandwidth of 200 kHz. Layout area and power consumption did not include the LO divider, bypass capacitors, or bond pads. In this non-limiting example design of FIG. 4, the packaging and external circuitry are created through integrated circuit (IC) and printed circuit board (PCB) design tools. The size of the IC itself was 1.5×1.5 mm. The IC was packaged in a large DIP-40 carrier. The packaged mixer is shown on a test PCB in FIG. 4. In particular, FIG. 4 shows a PCB 400 with optional IF combination circuitry, including harmonic recombination amplifiers and a polyphase filter combiner. The IC is powered with 5V, which may be configured via SPI by a microcontroller (Arduino Uno, not shown). External amplifiers and filters may be used to combine the eight IF outputs into a single IF port for noise figure measurements. The reference LO may be derived from an ADF4351 frequency synthesizer (Analog Devices).

For a 65 nm design simulation, a schematic-level design of an N=16 receiver core was created with the UMC 65 nm foundry design kit. The smaller feature size and wider variety of devices in this process allow large improvements in performance and density. The 65 nm design may use 1.2V and 2.5V MOS devices. The switch resistance may be adjusted between 2Ω and 20Ω. The 65 nm design may use PMOS sampling capacitors or other available capacitors.

Table I summarizes the results of the simulations for both 0.5 µm and 65 nm designs, and the experimental results for the 0.5 µm design, showing the performance of various designs at $f_{RF}$=64 MHz, $f_{IF}$=1 MHz.

The measurements were performed with the LNAs configured for maximum and minimum gain. The external IF combination circuitry had an overall gain of −2dB and an image rejection ratio of −30dB. The NFSSB was measured experimentally using the gain method such as described in "Three Methods of Noise Figure Measurement," Maxim Integrated, available at: https://www.maximintegrated.com/en/app-notes/index.mvp/id/2875, and was measured at the output of the IF combination chain. In addition to the power required by the mixer core (including the LNAs and mixer drivers), the 0.5 µm design used 30 mW for the LO divider.

This design demonstrates that parameters, such as package size, power consumption, and NF, can be accurately predicted with simulation. By following a similar design methodology with the 65 nm process, NF can be controlled near 0.5 dB while requiring a fraction of the power and area. Such a low NF makes the use of RF LNAs unnecessary; a matched coil can be fed directly to the mixer input, allowing for the mixer's wideband and tunable properties to be exploited.

Figure 5:
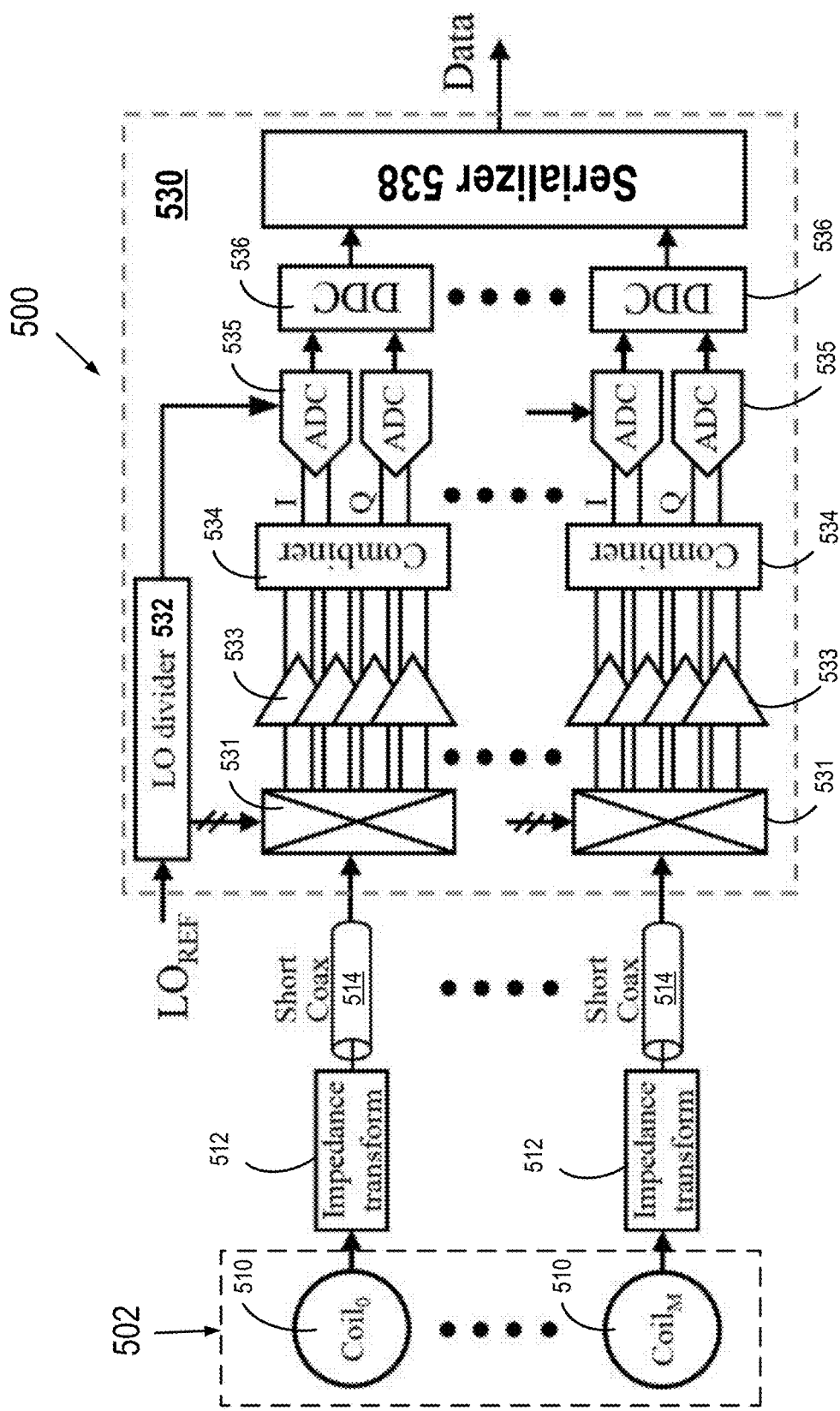
FIG. 5 is a block diagram of a multichannel receiver architecture without RF LNAs in accordance with the present disclosure.

Multiple N-path receiver cores may be implemented on a single chip. As shown in FIG. 5, a single chip 500 includes a semiconductor layer 530, a mixer 531 disposed in the semiconductor layer 530, and an electronic amplifier 533 disposed in the semiconductor layer 530. The mixer 531 is configured to receive magnetic resonance (MR) RF signal from a coil array 502 and converts the MR RF signal to an intermediate-frequency (IF) signal that is substantially less that the MR RF signal. For example, the mixer 531 may receive a reference signal from an LO divider 532 that takes a reference $LO_{REF}$ and divides it into M non-overlapping pulses with interleaved phase, where M is the number of coils in the coil array 502. The mixer 531 may be implemented with one or more transistors, for example, CMOS transistors. Alternatively or additionally, the mixer 531 may be implemented using other IC technology, which is not limited in this disclosure. In one receiving channel, the mixer 531 may receive the MR RF signal from the coil 510 via an impedance transformer 512 and a short coaxial cable 514.

The electronic amplifier 533 is electronically connected to the mixer 531 and configured to amplify the IF signal from the mixer 531 to an amplified IF signal. Thus, the electronic amplifier 533 works at the IF frequency instead of the RF frequency in the current RF system. In one non-limiting example, the MR RF frequency may be at 64 MHz, whereas the IF frequency may be at 1 MHz.

The single chip 500 also includes a combiner 534 disposed in the semiconductor layer 530. The combiner 534 is electronically connected to an electronic amplifier 533 and is configured to combine amplified signals from multiple electronic amplifiers. The single chip 500 further includes an analog-to-digital converter (ADC) 535 disposed in the semiconductor layer 530, where the ADC 535 is electronically

TABLE I

| Gain range | 0.5 µm simulated | | 0.5 µm measured | | 65 nm simulated | |
|---|---|---|---|---|---|---|
| | Low | High | Low | High | Low | High |
| Gain | 31.16 dB | 40.04 dB | 29.59 dB | 45.27 dB | 24.49 dB | 32.87 dB |
| $NF_{SSB}$ | 3.97 dB | 3.97 dB | 4.67 dB | 4.25 dB | 0.52 dB | 0.50 dB |
| IP1dB | −20.26 dBm | −29.8 dBm | −18.7 dBm | −36.3 dBm | −20.48 dBm | −28.4 dBm |
| DR | 100.9 dB | 87.1 dB | 97.6 dB | 80.5 dB | 100.0 dB | 92.1 dB |
| Core power | 71 mW | | 77 mW | | 53 mW | |
| Core area | 0.56 mm² | | 0.56 mm² | | 0.25 mm² | | connected to the combiner 534. The combiner 534 may be a passive electronic device that linearly mixes two or more signal sources into a common port. One of the differences between a combiner and a mixer is that the combiner does not produce additional frequency signals because it is linear.

The single chip 500 also includes a digital converter 536 disposed in the semiconductor layer 530, where the digital converter 536 is electronically connected to the ADC 535. For example, the digital converter 536 may be a digital downconverter (DDC), which may be implemented in logic on field-programmable gate arrays (FPGA) or application-specific integrated circuits (ASIC). The DDC is configured to convert the digitized signal from the ADC 535 to a lower frequency signal at a lower sampling rate and output the lower frequency signal to a serializer 538.

The single chip 500 also includes a serializer 538 electronically connected to the digital converter 536 and configured to generate serialized data to be sent to from the magnet room for processing. The single chip 500 may send the serialized data to the MR system over a non-RF cable or even a wireless link.

As described above with respect to FIG. 2A, this design removes the need for traditional single receiver channels 206 formed of a pre-amplifier 222, receiver attenuator 224, down converter 226, and ADC 232, which require a large inductor and expensive cables to communicate the high-frequency MR RF signal from each channel of the coil array 204 from the proximity of the magnet system 124 out of the magnet room. Instead, the design of FIG. 5 moves pre-amplification and down conversion onto a common chip 500 that is proximate to the coil and in the magnet room and allows an IF signal to be communicated from the magnet room to the digital detector and processor 234 of FIG. 2A. By communicating an IF signal from proximate to the coil array 204 rather than the high-frequency MR RF signal, cabling from the coil array 204 can be of lower cost because it does not need to carry the high-frequency MR RF signal.

In short, FIG. 5 shows an example chip architecture that works as a multichannel receiver without RF LNAs. The IF quadrature outputs of each channel are sampled by separate ADCs. A digital converter such as a digital downconverter (DDC) may be used to combine IF quadrature data into complex baseband data. A serializer combines all channels to be sent to the host over a common medium. Each of the M coil channels feeds a mixer core, all of which share a common LO bus. The N interleaved IF ports of each receiver core can be reduced to quadrature outputs, which are sampled by matched integrated ADCs. The M results are digitally downconverted (DDC) then combined and serialized over a single digital link. This allows for on-coil digitization with relatively low power compared to direct sampling of the RF with a single ADC. M channels can be supported with a single cable carrying DC power and the reference LO, while a fiber optic or wireless link can be used to transmit the digital output back to the scanner.

Figure 6A:
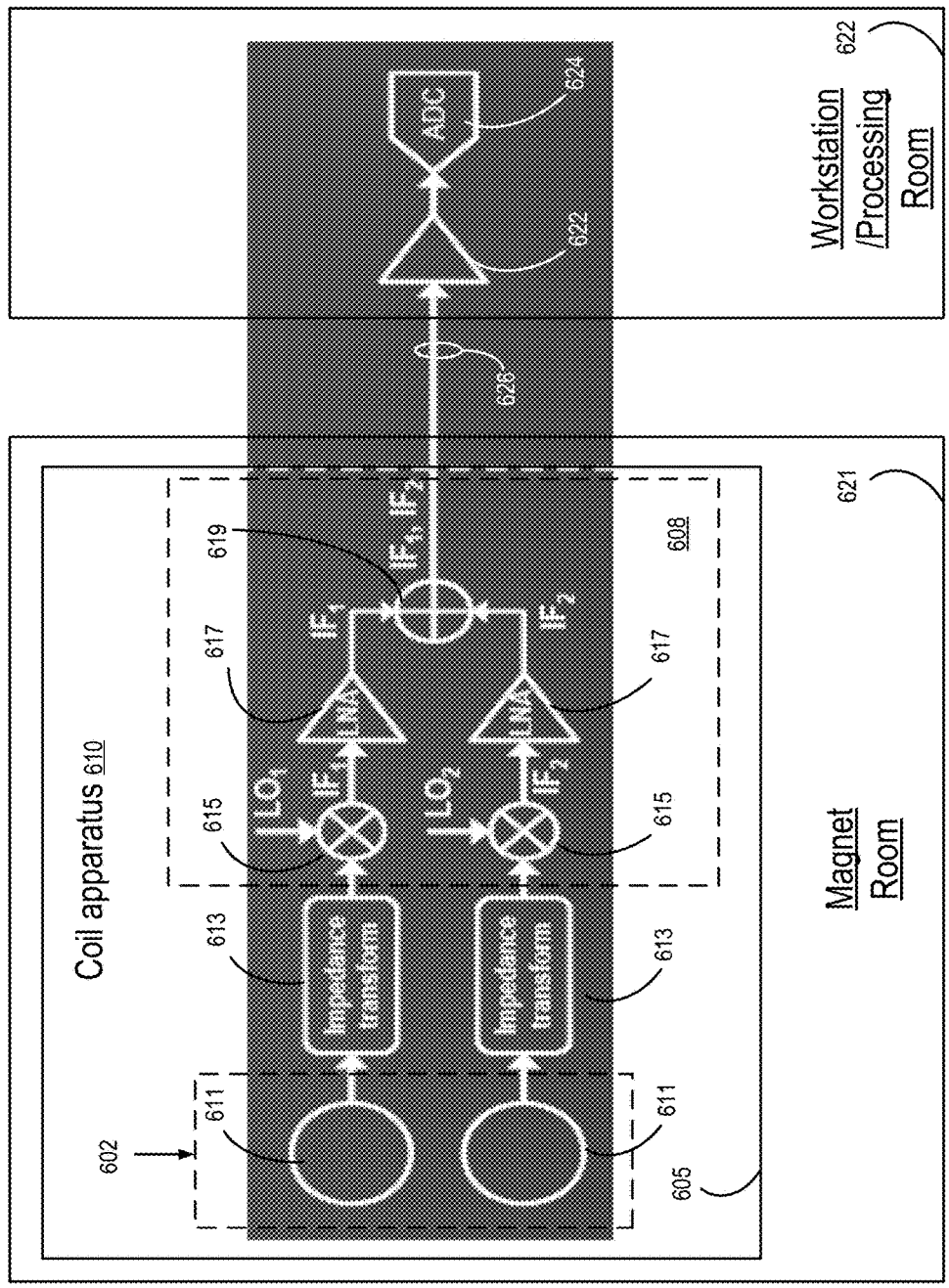
FIG. 6A is a block diagram of an example coil apparatus without RF LNAs in accordance with the present disclosure.

FIG. 6A is a block diagram of an example coil apparatus 610 without RF LNAs in accordance with the present disclosure. The coil apparatus 610 may include an RF coil array 602 disposed at least partially in a coil housing 605, where the RF coil array 602 may include at least one coil 611 configured to receive MR RF signals. The coil apparatus 610 also includes a mixer 615 disposed in the coil housing 605 and electronically connected to the RF coil array 602, where the mixer 615 converts the MR RF signal from the RF coil array 602 to an IF signal.

The coil apparatus further includes an electronic amplifier 617 that is disposed in the coil housing 605. The electronic amplifier 617 is electronically connected to the mixer 615 and is configured to amplify the IF signal from the mixer 615 to an amplified IF signal. As one non-limiting example, the MR RF signal from the RF coil array 602 may have an RF frequency at approximately 63.6 MHz or higher, while the IF frequency of the IF signal may be at a frequency between 1 MHz and 5 MHz. In one example, the IF frequency is at about 1 MHz.

Further, the mixer 615 and the electronic amplifier 617 may be packaged in a circuit system 608 disposed in the coil housing 605. Here, the chip 608 includes a combiner 619 connected to two amplifiers 617. The combined signal is then sent from a magnet room 620 to a processing room 621 for further processing. For example, the processing room 621 may include an amplifier 622 and an ADC 624. Again, because the circuit system 608 is designed to generate the IF signal inside the magnet room 621 and proximate to the coil array 602 rather than the high-frequency MR RF signal, cabling from the coil array 602/magnet room 621 to the workstation processing room 622 can be of lower cost because it does not need to carry the high-frequency MR RF signal.

Of course, the particular architecture of the system 608 of FIG. 6A is but one non-limiting example. For example, the system 608 may have a structure similar to the example chip 500 in FIG. 5. Furthermore, referring to FIG. 6B a block diagram of coil apparatus 650 and circuit system 648 without RF LNAs, and related operating environment 621, 622, is illustrated. The coil apparatus 650 may include an RF coil array 642 disposed at least partially in a coil housing 645, where the RF coil array 642 may include at least one coil 651 configured to receive MR RF signals. The coil apparatus 650 is coupled to a circuit system 648 that includes a mixer 655. The circuit system may be coupled to or disposed in the coil housing 645 and electronically connected to the RF coil array 642, where the mixer 655 converts the MR RF signal from the RF coil array 642 to an IF signal.

The coil apparatus further includes an electronic amplifier 657 that operates at the IF frequency band, not the RF frequency band. The electronic amplifier 657 may include an LNA that amplifies a low-power signal without significantly degrading its signal-to-noise ratio (SNR). The amplifier 657 may increase the power of both the signal and the noise present at its input. Generally, a noise figure may be used to help determine the efficiency of a particular LNA. As shown in Table I, the 65 nm design has a much lower noise figure compared with the 0.5 µm design.

Figure 6B:
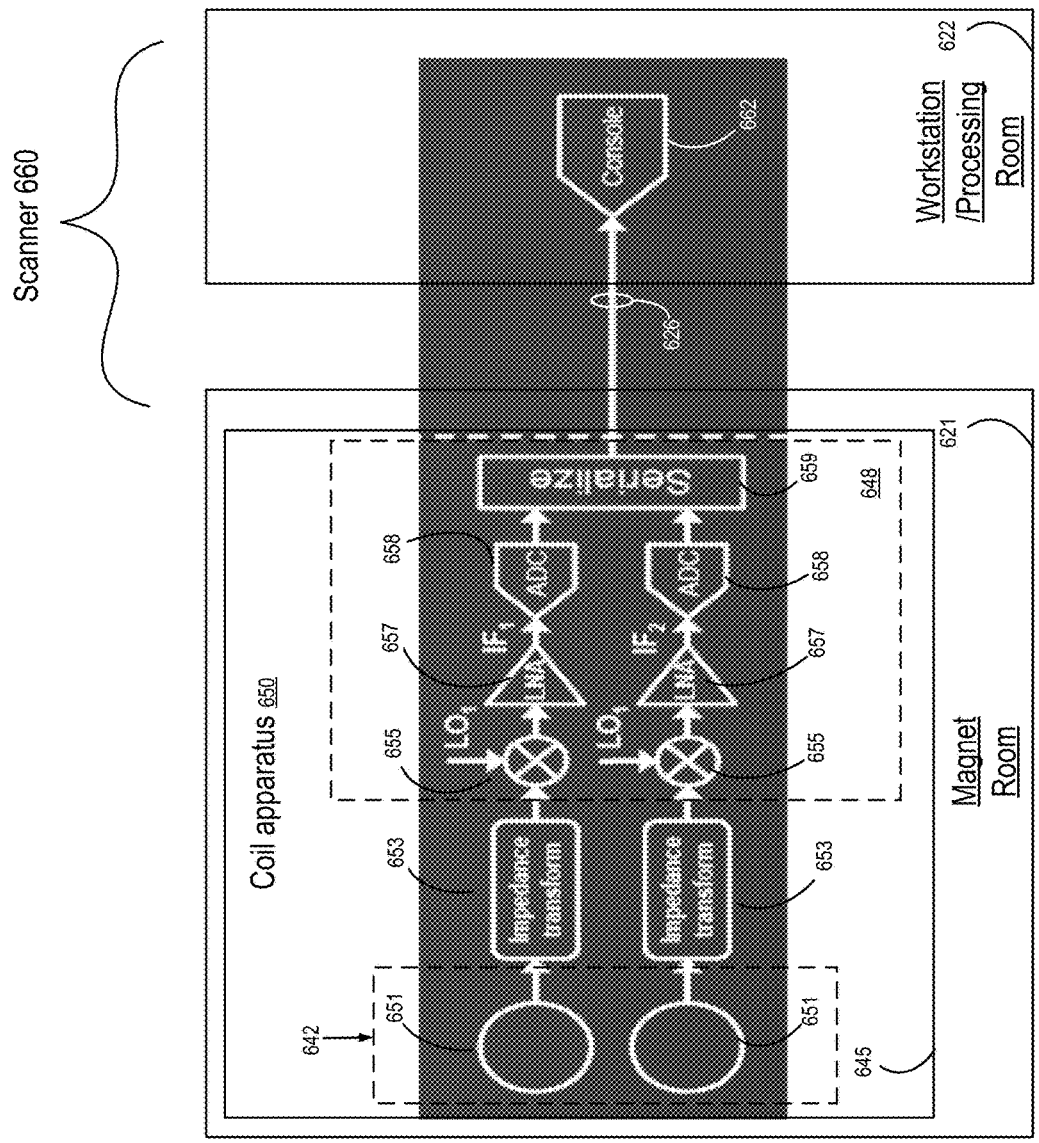
FIG. 6B is a block diagram of an example coil apparatus without RF LNAs in accordance with the present disclosure.

In FIG. 6B, the circuit system 648 further includes an ADC 658 electronically connected to the amplifier 657. The ADC 658 converts analog signals from the electronic amplifier 657 to digital signals and then sends the digital signals to the serializer 659. The serializer 659 may have multiple input ends and one output end. On the input ends, the serializer 659 is electronically connected to a plurality of ADCs 658 and configured to receive the digital signals from the plurality of ADCs 658. On the output end, the serializer 659 is electronically connected to a low-frequency cable 626 and outputs the low-frequency signal to a workstation or processing room 622, or other location with a console 622. Here, the low-frequency signal may have a frequency band between 0.5 MHz to 1.5 MHz. Preferably, the low-frequency signal may have a frequency band between 0.8 MHz to 1.2 MHz.

The console 662 may be a user workstation or part of the MR scanner, such as the operator workstation 102, networked workstation 142, data acquisition server 112, or data processing server 114 in FIG. 1. Alternatively or additionally, the console 662 may be any other computing device.

In this disclosure, a system is provided to address the needs in packaging more and more coil elements in one coil array, while removing the need for high-Q inductors by moving the amplifiers and mixers directly to the coil. The disclosed coil apparatus does not need the high-Q inductors because it introduces a chip or circuit system that combines the mixers and amplifiers without sacrificing SNR or image quality of the MR system. The system may implement multiple receiving channels in one chip by using multiple first-stage mixers with a common IF. There is no need to include high-Q inductors on the chip. Further, the chip does not need a complicated diplexer for channel combination. Furthermore, the system removes the need for a high-frequency cable to connect the coil apparatus with the MR system because the output signal may be a signal at or near baseband.

Using the disclosed system, the receive coil array may include more coil elements in the coil housing. Compared with current preamplifiers with a volume at $20 \times 40 \times 5$ mm$^3$ (i.e., 4000 mm$^3$) a receiving channel in the chip may have a volume less than 25 mm$^3$. The power for each receiving channel is also lower compared with the current receiving channel. Heteronuclear applications are possible using the disclosed chip. Therefore, a new system for use with an MR coil system is provided that yields a less complicated structure and costs significantly less than current coils and associated systems.

The present invention has been described in terms of one or more preferred embodiments, and it should be appreciated that many equivalents, alternatives, variations, and modifications, aside from those expressly stated, are possible and within the scope of the invention.

We claim:

1. An apparatus, comprising:
   a radio-frequency (RF) coil array disposed at least partially in a coil housing, the RF coil array comprising at least one coil configured to receive magnetic resonance (MR) RF signal;
   a mixer disposed in the coil housing and electronically connected to the RF coil array, wherein the mixer converts the MR RF signal from the RF coil array to an intermediate-frequency (IF) signal; and
   an electronic amplifier disposed in the coil housing, the electronic amplifier being electronically connected to the mixer and configured to amplify the IF signal from the mixer to an amplified IF signal.

2. The apparatus of claim 1, wherein the mixer and the electronic amplifier are packaged in a single integrated circuit chip disposed in the coil housing.

3. The apparatus of claim 1, further comprising:
   an analog-to-digital converter electronically connected to the electronic amplifier.

4. The apparatus of claim 3, wherein the analog-to-digital converter converts analog signals from the electronic amplifier to digital signals.

5. The apparatus of claim 4, further comprising: a serializer electronically connected to the analog-to-digital converter and configured to receive the digital signals from the analog-to-digital converter.

6. The apparatus of claim 5, wherein the serializer is electronically connected to a low-frequency cable and outputs a low-frequency signal to a magnetic resonance scanner.

7. The apparatus of claim 1, further comprising:
   a combiner connected to the electronic amplifier;
   an analog-to-digital converter (ADC) electronically connected to the combiner; and
   a digital converter electronically connected to the ADC.

8. The apparatus of claim 7, further comprising:
   a serializer electronically connected to the digital converter and configured to generate serialized data to be sent to an MR system.

9. A magnetic resonance imaging (MRI) system, comprising:
   a magnet system configured to generate a static magnetic field about at least a region of interest (ROI) of a subject arranged in the MRI system;
   at least one gradient coil configured to establish at least one magnetic gradient field with respect to the static magnetic field;
   a radio frequency (RF) system configured to deliver at least one excitation pulse to the subject;
   at least one computer system configured to reconstruct images of the subject from image data acquired by the MRI system, wherein the magnet system, gradient coil, and RF system are arranged in a first location defining a magnet room and the at least one computer system is located in a second location that is magnetically distinct from the magnet room; and
   a receiver comprising:
   an RF coil array comprising at least one coil configured to receive magnetic resonance (MR) RF signal excited by the at least one excitation pulse in the ROI;
   a mixer electrically coupled to the RF coil array and arranged in the magnet room, wherein the mixer converts the MR RF signal from the RF coil array to an intermediate-frequency (IF) signal; and
   an electronic amplifier electrically connected to the mixer to amplify the IF signal from the mixer to an amplified IF signal and arranged in the magnet room.

10. The MRI system of claim 9, wherein the mixer and the electronic amplifier are packaged in a common integrated circuit chip disposed in the coil housing.

11. The MRI system of claim 10, wherein the receiver further comprises an analog-to-digital converter electronically connected to the electronic amplifier and arranged in the magnet room.

12. The MRI system of claim 11, wherein the analog-to-digital converter converts analog signals from the electronic amplifier to digital signals.

13. The MRI system of claim 12, wherein the receiver further comprises a serializer electronically connected to the analog-to-digital converter and configured to receive the digital signal from the analog-to-digital converter.

14. The MRI system of claim 13, wherein the serializer is electronically connected to a low-frequency cable and outputs a low-frequency signal to a data acquisition server in the MRI system.

15. The MRI system of claim 9, wherein the receiver further comprises:
   a combiner connected to the electronic amplifier;
   an analog-to-digital converter (ADC) electronically connected to the combiner; and
   a digital converter electronically connected to the ADC.

16. The MRI system of claim 15, wherein the receiver further comprises:

a serializer electronically connected to the digital converter and configured to generate serialized data to be sent to a data acquisition server in the MRI system.

17. An integrated circuit chip in a MR receiver, comprising:
   a semiconductor layer;
   a mixer disposed in the semiconductor layer and configured to receive magnetic resonance (MR) RF signals from a coil array and converts the MR RF signals to intermediate-frequency (IF) signals; and
   an electronic amplifier disposed in the semiconductor layer, the electronic amplifier being electronically connected to the mixer and configured to amplify the IF signals from the mixer to amplified IF signals.

18. The integrated circuit chip of claim 17, further comprising:
   a combiner disposed in the semiconductor layer, the combiner being connected to the electronic amplifier and configured to combine amplified signals from multiple electronic amplifiers; and
   an analog-to-digital converter (ADC) disposed in the semiconductor layer, the analog-to-digital converter being electronically connected to the combiner.

19. The integrated circuit chip of claim 18, further comprising:
   a local oscillator (LO) divider electronically connected to the mixer and the ADC, wherein the LO divider takes a reference LO signal and divides the reference LO signal into a plurality of non-overlapping signals with interleaved phase.

20. The integrated circuit chip of claim 18, further comprising:
   a digital converter disposed in the semiconductor layer, the digital converter being electronically connected to the ADC; and
   a serializer electronically connected to the digital converter and configured to generate serialized data to be sent to an MR system.

21. The apparatus of claim 1, wherein an output of the mixer is electrically connected to an input of the electronic amplifier.

22. The apparatus of claim 1, wherein the mixer is a passive N-path mixer that provides for frequency conversion of the MR RF signal.

23. The MRI system of claim 9, wherein an output of the mixer is electrically connected to an input of the electronic amplifier.

24. The MRI system of claim 9, wherein the mixer is a passive N-path mixer that provides for frequency conversion of the MR RF signal.

25. The integrated circuit chip of claim 17, wherein an output of the mixer is electrically connected to an input of the electronic amplifier on the integrated circuit chip.

26. The integrated circuit chip of claim 17, wherein the mixer is a passive N-path mixer that provides for frequency conversion of the MR RF signals.

* * * * *